(12) United States Patent
Singleton

(10) Patent No.: US 9,258,898 B2
(45) Date of Patent: *Feb. 9, 2016

(54) EMBEDDED ELECTRONIC DEVICE AND METHOD FOR MANUFACTURING AN EMBEDDED ELECTRONIC DEVICE

(71) Applicant: Fiteg, Inc., Tiburon, CA (US)

(72) Inventor: Robert Singleton, Plant City, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/270,064

(22) Filed: May 5, 2014

(65) Prior Publication Data
US 2014/0307404 A1 Oct. 16, 2014

Related U.S. Application Data

(63) Continuation of application No. 13/855,280, filed on Apr. 2, 2013, now Pat. No. 8,727,224, which is a continuation of application No. 11/455,936, filed on Jun. 20, 2006, now abandoned, application No. 14/270,064, which is a continuation of application No. 13/351,835, filed on Jan. 17, 2012, now abandoned.

(51) Int. Cl.
G06K 19/02 (2006.01)
H05K 1/18 (2006.01)
B29C 45/14 (2006.01)
G06K 19/077 (2006.01)
H05K 5/06 (2006.01)
H05K 1/03 (2006.01)
H05K 3/06 (2006.01)
H05K 3/28 (2006.01)

(52) U.S. Cl.
CPC .......... H05K 1/186 (2013.01); B29C 45/14647 (2013.01); B29C 45/14819 (2013.01); G06K 19/077 (2013.01); G06K 19/07724 (2013.01); H05K 1/0306 (2013.01); H05K 3/06 (2013.01); H05K 3/284 (2013.01); H05K 5/064 (2013.01)

(58) Field of Classification Search
CPC ................ B42D 15/10; G06K 19/077; G06K 19/07749; G07F 7/1008
USPC ...................... 235/488, 492; 29/841
See application file for complete search history.

(56) References Cited

U.S. PATENT DOCUMENTS 8,727,224 B2 * 5/2014 Singleton ...................... 235/488

* cited by examiner

Primary Examiner — Karl D Frech
(74) Attorney, Agent, or Firm — Roy L. Anderson

(57) ABSTRACT

An embedded electronic device and a method for manufacturing the same wherein the embedded electronic device is composed of a printed circuit board, having a top surface and a bottom surface, a plurality of circuit components attached to the top surface of the printed circuit board having a plurality of standoffs on the bottom surface of the printed circuit board, a bottom overlay attached to the bottom surface of the printed circuit board, a top overlay positioned above the top surface of the printed circuit board and a core layer positioned between the top surface of the printed circuit board and the top overlay.

10 Claims, 5 Drawing Sheets

EMBEDDED ELECTRONIC DEVICE AND METHOD FOR MANUFACTURING AN EMBEDDED ELECTRONIC DEVICE

CROSS-REFERENCE TO RELATED APPLICATIONS

This application claims priority from and is a continuation application of U.S. Ser. No. 13/855,280, filed Apr. 12, 2013, which itself was a continuation of U.S. Ser. No. 11/455,936, filed Jun. 20, 2011, the disclosures of which are specifically incorporated by reference herein.

This application also claims priority and is a continuation application of U.S. Ser. No. 13/351,835, filed Jan. 17, 2012, the disclosure of which is specifically incorporated herein by reference.

BACKGROUND OF THE INVENTION

The following description of the background of the invention is provided simply as an aid in understanding the invention and is not admitted to describe or constitute prior art to the invention.

Generally, embedded electronic devices can be used for various applications such as smart cards or tags. Smart cards/tags may be used as credit cards, bank cards, ID cards, telephone cards, security cards or similar devices. Smart cards/tags are generally constructed by assembling several layers of plastic sheets in a sandwich array. Further, smart cards/tags contain embedded electronic components that enable the smart card to perform a number of functions.

European Patent 0 350 179 discloses a smart card wherein electronic circuitry is encapsulated in a layer of plastic material that is introduced between the card's two surface layers. The method further comprises abutting a high tensile strength holding member against a side of a mould, locating the smart card's electronic components with respect to that side and then injecting a reaction moldable polymeric material into the mould such that it encapsulates the electronic components.

European Patent Application 95400365.3 teaches a method for making contact-less smart cards. The method employs a rigid frame to position and fix an electronic module in a void space between an upper thermoplastic sheet and a lower thermoplastic sheet. After the frame is mechanically affixed to the lower thermoplastic sheet, the void space is filled with a polymerizable resin material.

U.S. Pat. No. 5,399,847 teaches a credit card that is comprised of three layers, namely, a first outer layer, a second outer layer and an intermediate layer. The intermediate layer is formed by injection of a thermoplastic binding material that encases the smart card's electronic elements (e.g., an IC chip and an antenna) in the intermediate layer material. The binding material is preferably made up of a blend of copolyamides or a glue having two or more chemically reactive components that harden upon contact with air. The outer layers of this smart card can be made up of various polymeric materials such as polyvinyl chloride or polyurethane.

U.S. Pat. No. 5,417,905 teaches a method for manufacturing plastic credit cards wherein a mold tool comprised of two shells is closed to define a cavity for producing such cards. A label or image support is placed in each mold shell. The mold shells are then brought together and a thermoplastic material injected into the mold to form the card. The inflowing plastic forces the labels or image supports against the respective mold faces.

U.S. Pat. No. 5,510,074 teaches a method of manufacturing smart cards having a card body with substantially parallel major sides, a support member with a graphic element on at least one side, and an electronic module comprising a contact array that is fixed to a chip. The manufacturing method generally comprises the steps of: (1) placing the support member in a mold that defines the volume and shape of the card; (2) holding the support member against a first main wall of the mold; (3) injecting a thermoplastic material into the volume defined by the hollow space in order to fill that portion of the volume that is not occupied by the support member; and (4) inserting an electronic module at an appropriate position in the thermoplastic material before the injected material has the opportunity to completely solidify.

U.S. Pat. No. 4,339,407 discloses an electronic circuit encapsulation device in the form of a carrier having walls that have a specific arrangement of lands, grooves and bosses in combination with specific orifices. The mold's wall sections hold a circuit assembly in a given alignment. The walls of the carrier are made of a slightly flexible material in order to facilitate insertion of the smart card's electronic circuitry. The carrier is capable of being inserted into an outer mold. This causes the carrier walls to move toward one another in order to hold the components securely in alignment during the injection of the thermoplastic material. The outside of the walls of the carrier has projections that serve to mate with detents on the walls of the mold in order to locate and fix the carrier within the mold. The mold also has holes to permit the escape of trapped gases.

U.S. Pat. No. 5,350,553 teaches a method of producing a decorative pattern on, and placing an electronic circuit in, a plastic card in an injection molding machine. The method comprises the steps of (a) introducing and positioning a film (e.g., a film bearing a decorative pattern), over an open mold cavity in the injection molding machine; (b) closing the mold cavity so that the film is fixed and clamped in position therein; (c) inserting an electronic Circuit chip through an aperture in the mold into the mold cavity in order to position the chip in the cavity; (d) injecting a thermoplastic support composition into the mold cavity to form a unified card; and (e) thereafter, removing any excess material, opening the mold cavity and removing the card.

U.S. Pat. No. 4,961,893 teaches a smart card whose main feature is a support element that supports an integrated circuit chip. The support element is used for positioning the chip inside a mold cavity. The card body is formed by injecting a plastic material into the cavity so that the chip is entirely embedded in the plastic material. In some embodiments, the edge regions of the support are clamped between the load bearing surfaces of the respective molds. The support element may be a film that is peeled off the finished card or it may be a sheet that remains as an integral part of the card. If the support element is a peel-off film, then any graphics elements contained therein are transferred and remain visible on the card. If the support element remains as an integral part of the card, then such graphics elements are formed on a face thereof and, hence, are visible to the card user.

U.S. Pat. No. 5,498,388 teaches a smart card device that includes a card board having a through opening. A semiconductor module is mounted onto this opening. A resin is injected into the opening so that a resin molding is formed under such condition that only an electrode terminal face for external connection of said semiconductor module is exposed. The card is completed by mounting a card board having a through opening onto a lower mold of two opposing molding dies, mounting a semiconductor module onto the opening of said card board, tightening an upper die that has a gate leading onto a lower die and injecting a resin into the opening via the gate.

U.S. Pat. No. 5,423,705 teaches a disc having a disc body made of a thermoplastic injection molded material and a laminate layer that is integrally joined to a disc body. The laminate layer includes an outer clear lamina and an inner white and opaque lamina. An imaging material is sandwiched between these lamina.

U.S. Pat. No. 6,025,054 discloses a method for constructing a smart card using low shrinkage glue to hold the electronic devices in place during the devices immersion in thermosetting material that becomes the core layer of the smart card. The method disclosed in U.S. Pat. No. 6,025,054 has considerable drawbacks. Primarily, the disclosed method produces warping and other undesirable physical defects caused by the curing of thermosetting material. Further, this method is suitable only for cards having one or two components, thus limiting its functionality. In addition, the method disclosed in U.S. Pat. No. 6,025,054 creates defects such as voids and air bubbles within a smart card because the geometric shapes of the electronic components within the card obstruct the flow of the thermosetting material such that the thermosetting material flows around the components faster than the air can be pushed out of the core of the smart card. Moreover, U.S. Pat. No. '054 requires the use of custom equipment, significantly limiting the scope and scalability of its application.

In view of the following, there is a need for a device and a method of constructing the device that is capable of housing numerous electrical components.

SUMMARY OF THE INVENTION

The present invention is generally directed to methods for manufacturing embedded devices, such as electronic cards, in which a bottom surface of a circuit board is affixed to a bottom overlay (or sheet), the circuit board and bottom overlay are loaded into an injection molding apparatus, a top overlay (or sheet) is loaded into the injection molding apparatus, and thermosetting polymeric material (e.g., polyurea) is injected into the molding apparatus between the top surface of the circuit board to thereby effectively bond the top and bottom overlays to the circuit board and hold electronic components affixed to, and in electrical contact with, the circuit board. It is especially preferred that the bottom sheet is directly and uniformly attached with an adhesive to the bottom surface of the circuit board over their entire common surfaces.

It is to be understood that both the foregoing general description and the following detailed description are exemplary and explanatory only, and are not restrictive of the invention as claimed.

BRIEF DESCRIPTION OF THE DRAWINGS

These and other features, aspects and advantages of the present invention will become apparent from the following description, appended claims, and the accompanying exemplary embodiments shown in the drawings, which are briefly described below.

DETAILED DESCRIPTION OF THE INVENTION

Embodiments of the present invention will be described below with reference to the accompanying drawings. It should be understood that the following description is intended to describe exemplary embodiments of the invention, and not to limit the invention.

Figure 1:
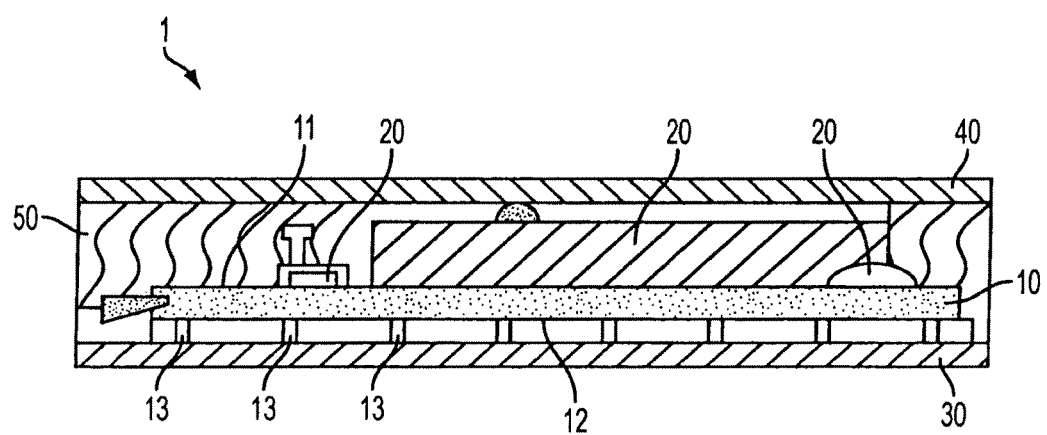
FIG. 1 is a sectional view of an embedded electronic device according to one embodiment of the present invention.

According to one embodiment of the present invention, as shown in FIG. 1, an embedded electronic device 1 comprises a printed circuit board 10, a plurality of circuit components 20, a bottom overlay 30, a top overlay 40 and a core layer 50. The embedded electronic device may be used in such applications as smart cards, tags and/or wristbands.

The printed circuit board 10 has a top surface 11 and a bottom surface 12. According to one embodiment of the invention, the printed circuit board 10 is double-sided. Accordingly, the printed circuit board 10 is configured to accommodate a plurality of circuit traces 14 (shown in FIG. 2) on the top surface 11 and on the bottom surface 12. The circuit traces 14 are configured to operably connect the plurality of circuit components 20 affixed to the printed circuit board 10. The circuit traces 14 electrically connect to the plurality of circuit components 20 such that the circuit components are capable of performing electrical functions within the embedded electronic device 1.

The circuit traces 14 may be provided upon the surfaces 11, 12 of the printed circuit board in numerous ways. For example, the circuit traces 14 may be formed on the printed circuit board 10 with conductive ink. In the alternative, Circuit traces 14 may be etched onto the printed circuit board.

The printed circuit board 10 is comprised of any known conventional material suitable for receiving an electronic circuit. For example, the printed circuit board 10 may be comprised of a flame retardant laminate with a woven glass reinforced epoxy resin. This material is also known as FR-4 hoard. Alternatively, the printed circuit board 10 may be comprised of a plastic compound that is suitable for receiving conductive ink.

Figure 3:
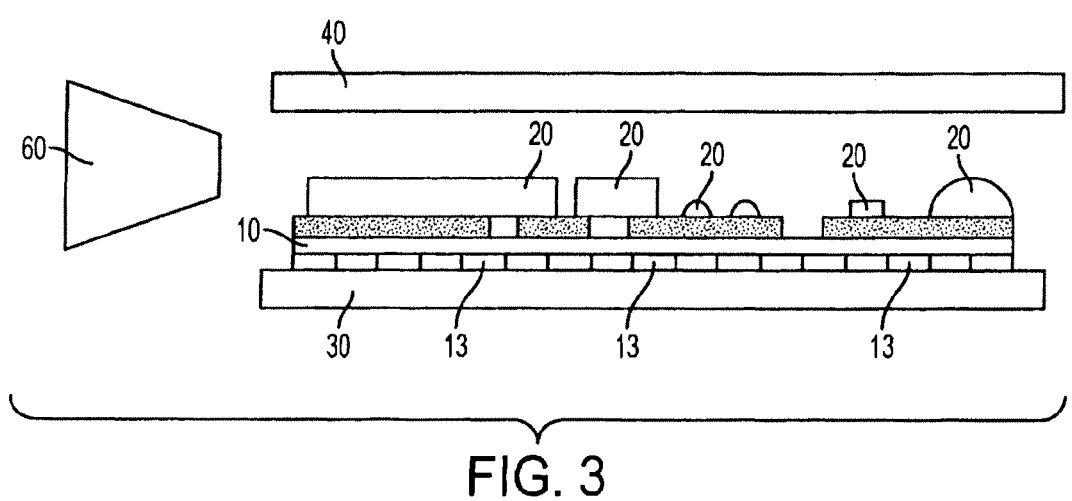
FIG. 3 is a sectional view of an embedded electronic device and an injection nozzle according to one embodiment of the present invention.
Figure 4:
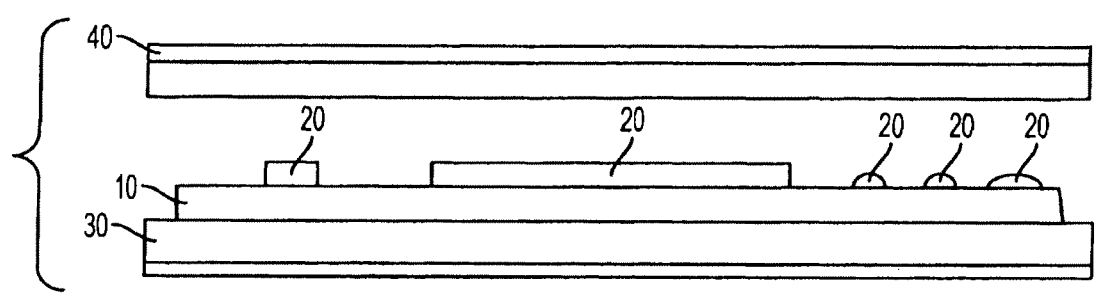
FIG. 4 is a sectional view of an embedded electronic device according to one embodiment of the present invention.

According to one embodiment of the invention, as shown in FIGS. 1 and 3 the bottom surface 12 of the printed circuit board 10 includes standoffs 13. Preferably, the standoffs 13 are arranged in a dot-pattern on the bottom surface 12 of the printed circuit board 10 to allow the core layer 50 to be positioned between the bottom surface 12 of the printed circuit board 10 and the bottom overlay 30. The plurality of standoffs 13 may be affixed to the bottom overlay 30 in a number of ways. For example, the plurality of standoffs 13 may be affixed using pressure sensitive adhesive tape or a spray-on adhesive. According to another embodiment of the invention, the plurality of standoffs 13 are comprised of copper. According to yet another embodiment of the invention, circuit components may be positioned on the bottom surface 12 of the printed circuit board 10 along with a plurality of standoffs 13.

As shown in FIG. 1, and described below, the printed circuit board 10 is configured to receive and vertically stabilize a plurality of circuit components. The plurality of circuit components 20 may be attached to the printed circuit board 10 and specifically to the circuit traces 14 by any one of a number of methods. For example, in one embodiment of the invention, the circuit components 20 are connected to the printed circuit board 10 with a conductive adhesive. Preferably, the plurality of circuit components are soldered onto the printed circuit board 10. The plurality of circuit components 20 can be positioned anywhere on the printed circuit board 10 as desired. The purpose of the embedded electronic device 1 and design parameters will dictate the position of the circuit traces 14 and the position of the circuit components 20. Functionality will also dictate what types of circuit components 20 populate the printed circuit board 10.

Figure 2:
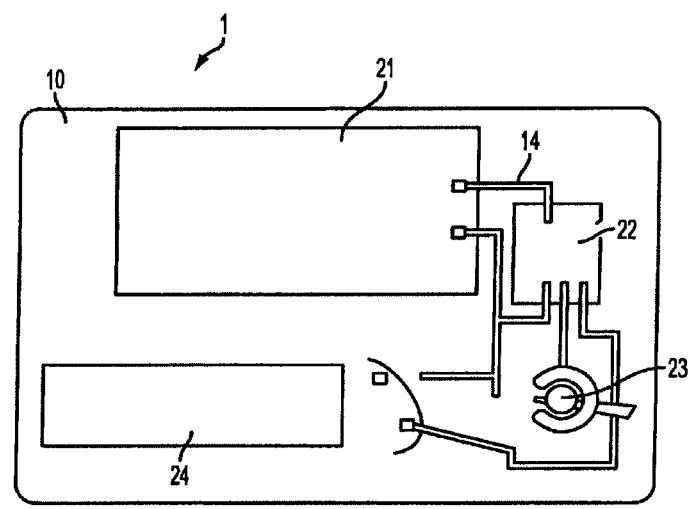
FIG. 2 is a top sectional view of an embedded electronic device according to one embodiment of the present invention.

For example purposes only, the plurality of Circuit components 20 could be one of a battery, a button, a microprocessor chip or a speaker. Any one or all of these circuit components could populate the printed circuit board 10. Further, additional circuit components 20 may include but are not limited to LEDs, flexible displays, REID antennas and emulators. Referring to FIG. 2, a circuit layout for an embedded electronic device 1 is shown. The printed circuit board 10 shown in FIG. 2 is populated by a battery 21, a microprocessor 22 and a button 23. In another embodiment of the present invention as shown in FIG. 2, the embedded electronic device 1 includes a liquid crystal display 24 as the circuit component 20 connected to the button 23. The liquid crystal display 24 may be used to display information to a user, such as an account balance. In the alternative or in addition to, the embedded electronic device 1 shown in FIG. 2 may include a speaker (not shown).

Generally, the components shown in FIG. 2 may vary in thickness and length. For example purposes only, the battery 21 has a thickness of 0.016 inches, the push button 23 has a thickness of 0.020 inches and the microprocessor 22 has a thickness of 0.015 inches. In addition, the embedded electronic device 1 shown in FIG. 2 could have a speaker (not shown) having a thickness of 0.010 inches.

As shown in FIG. 1, a bottom overlay is attached to the bottom surface 12 of the printed circuit board 10. The bottom overlay 30 can be attached to the printed circuit board 10 by any number of known methods. Preferably, the bottom surface 12 (having standoffs 13) is attached to the bottom overlay 30 using a pressure sensitive adhesive tape or a spray-on adhesive. The bottom overlay 30 may be comprised of any suitable material but preferably, the bottom overlay 30 is comprised of polyvinyl chloride (PVC) or like material. According to one embodiment of the invention, the surface of the bottom overlay 30 in contact with the printed circuit board 10 has printed information. Alternatively printed information may be placed on the outside surface of the bottom overlay 30. For example, the bottom overlay 30 may include printed information consistent with a standard credit card or identification tag, including a name, expiration date and account number. According to another embodiment of the invention, the bottom overlay 30 may be clear or ⅖ clear/white printed. Specifically, a 0.002 inch thick piece of clear PVC material is laminated on to a layer of white PVC that is 0.005 inches in thickness.

A top overlay 40 positioned above the top surface of the printed circuit board 10 is shown in FIG. 1. The top overlay 40 may be comprised of any suitable material, for example, the top overlay 40 may be comprised of polyvinyl chloride (PVC) or like material. According to one embodiment of the invention, the surface of the top overlay 40 in contact with the core layer 50 has printed information. Alternatively, the outside surface of the top overlay 40 may have printed information. For example, the top overlay 40 may include printed information consistent with a standard credit card or identification tag, including a name, expiration date and account number. According to another embodiment of the invention, the top overlay 40 may be clear or "⅖ clear/white printed."

As shown in FIG. 1, a core layer 50 is positioned between the top surface of the printed circuit board 10 and the top overlay 40. In addition, as shown in FIG. 1, the core layer 50 is present in an area below the bottom surface 11 of the printed circuit board 10 and above the bottom overlay 30. Preferably, the core layer 50 is composed of a thermosetting polymeric material. For example, the core layer 50 is composed of polyurea.

Polyurea is a known elastomer that is derived from the reaction product of an isocyanate component and a resin blend component. See What is polyurea? THE POLYUREA DEVELOPMENT ASSOCIATION, at http://www.pda-online.org/pdarcsources/whatispoly.asp (last visited Mar. 21, 2006). The isocyanate can be aromatic or aliphatic in nature. Id. It can be monomer, polymer, or any variant reaction of isocyanates, quasi-prepolymer or a prepolymer. Id. The prepolymer, or quasi-prepolymer, can be made of an amine-terminated polymer resin, or a hydroxyl-terminated polymer resin. Id. The resin blend must be made up of amine-terminated polymer resins, and/or amine-terminated chain extenders Id. The amine-terminated polymer resins will not have any intentional hydroxyl moieties. Id. Any hydroxyls are the result of incomplete conversion to the amine-terminated polymer resins. Id. The resin blend may also contain additives, or non-primary components. Id. These additives may contain hydroxyls, such as pre-dispersed pigments in a polyol carrier. id. Normally, the resin blend will not contain a catalyst(s). Id.

Polyurea has numerous advantages over other conventional materials currently being used in similar applications. Polyurea has a high resistance to UV light. In addition, polyurea has low elasticity and elongation characteristics. This enables the embedded electronic device 1 to remain rigid. Further, polyurea has high bonding properties, allowing it to effectively bond the top and bottom overlays 40, 30 to the circuit components. The circuit components are also held rigidly in place due to the fact that polyurea has a low shrink factor. The embedded electronic device of the present invention also possess desirable environmental characteristics due to polyurea's low moisture absorption and stability at high temperatures.

A method for manufacturing an electronic embedded device according to the present invention will now be described.

First, a printed circuit board 10 is provided. The printed circuit board 10 has a top surface 11 and a bottom surface 12. Circuit traces 14 are present on the top surface 11 of the printed circuit board 10. Alternatively, the printed circuit board may be double-sided having circuit traces 14 on the top surface 11 and the bottom surface 12. According to one embodiment of the invention, the bottom surface 12 of the printed circuit board 10 has a plurality of standoffs 14.

Next, a plurality of circuit components 20 are then positioned onto the printed circuit board 10 and electrically connected to the circuit traces 14 on the top and or bottom surface of the printed circuit board 10. The circuit components 20 may be connected by any one of several methods including the use of double-sided electrically conducting tape. Preferably, the plurality of circuit components 20 are connected via a conventional soldering process.

Next, the bottom surface 12 of the printed circuit board 10 is affixed to the bottom overlay 30. Preferably, the bottom surface 12 (having standoffs 13) is attached to the bottom overlay 30 using a pressure sensitive adhesive tape or a spray-on adhesive.

The printed circuit board 10, attached to the bottom overlay 30 is then loaded as one complete sheet into an injection molding apparatus. A top overlay 40 is placed into the injection molding apparatus and positioned such that the top overlay 40 is above the top surface 11 of the printed circuit board 10. Specifically, the injection molding apparatus may be a reaction injection molding machine ("which is often individually referred to as "RIM"). These machines are associated with a top mold shell and a bottom mold shell that are capable of performing cold, low pressure, forming operations on at least one of the sheets of polymeric material (e.g., PVC) that make up the top 40 and bottom 30 overlay. Such top and bottom mold shells cooperate in ways that are well known to those skilled in the polymeric material molding arts.

The injection molding apparatus then injects thermosetting polymeric material via a nozzle 60 (shown in FIG. 3) between the top overlay 40 and the bottom overlay 30 forming the core layer 50 from thermosetting polymeric material. Preferably, as mentioned above, the thermosetting polymeric material is polyurea.

Cold, low pressure forming conditions generally mean forming conditions wherein the temperature of the core layer 50 consisting of thermosetting polymeric material, is less than the heat distortion temperature of the top 40 and bottom 30 overlays, and the pressure is less than about 500 psi. Preferably, the cold forming temperatures will be at least 100° F. less than the heat distortion temperature of the top 40 and bottom 30 overlays. The heat distortion temperature of many polyvinyl chloride (PVC) materials is about 230 degrees F. Thus, the temperatures used to cold form such PVC sheets in the present invention will be no more than about (230° F.-100° F.) 130° F.

According to one embodiment of the invention, the more preferred cold, low pressure forming procedures will involve injection of thermosetting polymeric materials with temperatures ranging from about 56° F. to about 160° F., under pressures that preferably range from about atmospheric pressure to about 500 psi. In another embodiment of the invention, the temperatures of the thermosetting polymeric material being injected into the embedded electronic device 1 will be between about 100° F. and about 120° F. under injection pressures that preferably range from about 80 to 120 psi. In one embodiment of the invention, the liquid or semi-liquid thermosetting polymeric material will be injected under these preferred temperature and pressure conditions at flow rates ranging from about 0.1 to about 70 grams/second. Flow rates of 30 to 50 grams/second are even more preferred.

It should be noted that the use of such relatively cold, low pressure, forming conditions may require that any given gate (i.e., the passageway that connects a runner with each individual device-forming cavity) be larger than those gates used in prior art. hot, high pressure operations. Preferably, the gates are relatively larger than prior art gates so that they are able to quickly pass the thermosetting polymeric material being injected under the cold, low pressure forming conditions. Similarly, the runner (i.e., the main thermosetting polymeric material supply passageway in the mold system that feeds from the source of the thermosetting material to each individual gate), will normally be in a multi-gate or manifold array, and, hence, should be capable of simultaneously supplying the number of gates/device-forming cavities (e.g., 4 to 8 cavities) in the manifold system at the relatively cold temperature (e.g., 56° F. to 160° F.) and relatively low pressure (e.g., atmospheric pressure to 500 psi) conditions used in the process. The flow rates for the polymeric thermosetting material under the low temperature and pressure conditions are able to completely fill a given device-forming cavity in less than or about 10 seconds per device-forming cavity (and more preferably in less than about 3 seconds). Preferably, device-forming cavity fill times of less than 1 second are even more preferred. In view of these conditions, the processes may employ gates having a width that is a major fraction of the length of a leading edge of the device to be formed (that is, a device edge that is connected to a gate). Preferably, the width of a given gate is about 20 percent to about 200 percent of the width of the leading edge (or edges—multiple gates can be used to fill the same device-forming cavity), i.e., the "gated" edge(s), of the embedded electronic being formed.

Preferably, gates are employed that are tapered down from a relatively wide inflow area to a relatively narrow core region that ends at or near the leading edge(s) of the device being formed. Most preferably, these gates will narrow down from a relatively wide diameter (e.g., from about 5 to about 10 mm) injection port that is in fluid connection with the thermosetting material-supplying runner, to a relatively thin diameter (e.g., 0.10 mm) gate/device edge where the gate feeds the thermosetting material into the void space which ultimately becomes the center or core of the finished embedded electronic device 1. Gates that taper from an initial diameter of about 7.0 millimeters down to a minimum diameter of about 0.13 mm will produce especially good results under the preferred cold, low-pressure injection conditions.

Another optional feature that can be used is the use of mold shells that have one or more receptacles for receiving "excess" polymeric material that may be purposely injected into the void space between the top 40 and bottom 30 layers in order to expunge any air and/or other gases (e.g., those gases formed by the exothermic chemical reactions that occur when the ingredients used to formulate most polymeric thermoset materials are mixed together) from said void space. These thermoset ingredients are preferably mixed just prior to (e.g., fractions of a second before) their injection into the void space.

Figure 5:
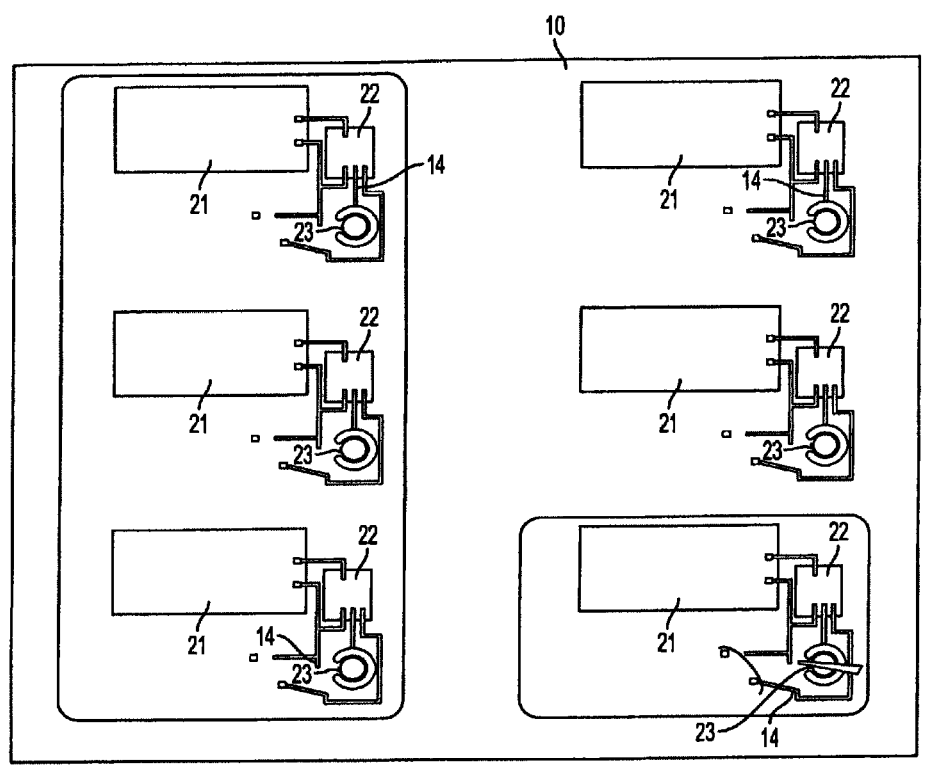
FIG. 5 is a top sectional view of a series of embedded electronic devices formed on one molded sheet according to one embodiment of the present invention.

After the injection of the thermosetting polymeric material, the molded structure is then removed from the injection molded apparatus. According to one embodiment of the invention, several embedded electronic devices 1 are cut out of one molded sheet. FIG. 5 depicts several embedded electronic devices formed on one sheet. According to another embodiment of the invention, the injected sheet corresponds to a embedded electronic device 1. The stiffness of the embedded electronic device 1 will depend upon the materials used in the composition of each of the embedded electronic devices 1 individual components.

The finished embedded electronic devices 1 are then removed from the excess polymeric materials (e.g., by trimming them off of the precursor device body) and cut to certain prescribed sizes (e.g., 85.6 mm by 53.98 mm as per ISO Standard 7810) dependent upon the functionality and design parameters of the embedded electronic device 1. The trimming process may also remove the excess material in one cutting/trimming operation. It also will be well appreciated by those skilled in this art that the molding devices used to make such devices in commercial production operations will most preferably have mold shells having multiple cavities (e.g., 2, 4, 6, 8, etc.) for making several such devices simultaneously.

The present invention has several advantages including a cost effective manner to produce one or more embedded electronic devices. Most of the modules in the embedded electronic device 1 can be constructed in a traditional manner that reduces manufacturing costs. In addition, through the use of polyurea and the standoffs, the method produces a more rigid card or tag that is less likely to have internal stress points that can cause deformation or warping. Moreover, the method of the present invention can be easily adapted to produce multiple embedded electronic devices at once.

The foregoing description of a preferred embodiment of the invention has been presented for purposes of illustration and description. It is not intended to be exhaustive or to limit the invention to the precise form disclosed, and modifications and variations are possible in light of the above teaching or may be acquired from practice of the invention. The embodiment was chosen and described in order to explain the principles of the invention and as a practical application to enable one skilled in the art to utilize the invention in various embodiments and with various modification are suited to the particular use contemplated. It is intended that the scope of the invention be defined by the claims appended hereto and their equivalents.

What is claimed is:

1. A method for manufacturing an embedded electronic device, comprising:
    providing a circuit board having a top surface and a bottom surface, a plurality of circuit components being affixed onto the top surface of the circuit board such that the plurality of circuit components are in direct electrical contact with the top surface of the circuit board;
    affixing the bottom surface of the circuit board to a bottom overlay using an adhesive so that the bottom surface of the circuit board is directly and uniformly attached to the bottom overlay over their entire common surfaces;
    loading the circuit board and bottom overlay into an injection molding apparatus;
    loading a top overlay positioned above a top surface of the circuit board into the injection molding apparatus; and
    injecting a thermosetting polymeric material between the top surface of the circuit board, the plurality of circuit components, and the top overlay, which thermosetting polymeric material is in physical contact with the plurality of circuit components.

2. The method of claim 1, wherein the thermosetting polymeric material is polyurea.

3. The method of claim 1, wherein a plurality of embedded electronic devices are formed on one circuit board.

4. The method of claim 3, further comprising:
    removing the injected top and bottom overlay from the mold; and
    cutting out the plurality embedded electronic devices.

5. The method of claim 1, wherein the circuit traces are formed by etching traces into the circuit board.

6. The embedded electronic device of claim 1, wherein the thermosetting polymeric material bonds the top overlay and the bottom overlay to the plurality of circuit components.

7. The method of claim 1, wherein the thermosetting polymeric material bonds the top overlay and the bottom overlay to the plurality of circuit components.

8. A method for manufacturing an electronic card, comprising:
    providing a circuit board having a top surface and a bottom surface, a plurality of circuit components being affixed onto and in electrical contact with the top surface of the circuit board;
    affixing the bottom surface of the circuit board to a bottom sheet using an adhesive;
    loading the circuit board and bottom sheet into an injection molding apparatus;
    loading a top sheet positioned above a top surface of the circuit board into the injection molding apparatus; and
    injecting a thermosetting polymeric material between the top sheet and the circuit board to bond the top sheet to the plurality of circuit components.

9. The method of claim 8, wherein the bottom sheet is directly and uniformly attached to the bottom surface of the circuit board over their entire common surfaces.

10. The method of claim 9, further comprising:
    injecting the thermosetting polymeric material between the bottom sheet and the circuit board to bond the bottom sheet to the bottom surface.

* * * * *